United States Patent [19]

Dshkhunian et al.

[11] Patent Number: 4,488,264
[45] Date of Patent: Dec. 11, 1984

[54] TRANSISTOR STORAGE

[76] Inventors: Valery L. Dshkhunian, K-482, korpus 338A, kv. 73; Sergei S. Kovalenko, K-498, korpus, 421, kv. 3; Pavel R. Mashevich, K-482, korpus 338"A", kv. 139; Vyacheslav V. Telenkov, K-527, korpus 811, kv. 75, all of Moscow, U.S.S.R.

[21] Appl. No.: 387,049

[22] Filed: Jun. 10, 1982

[51] Int. Cl.³ .............................................. G11C 13/00
[52] U.S. Cl. .................................... 365/189; 365/230
[58] Field of Search ........................ 365/174, 189, 230

[56] References Cited

U.S. PATENT DOCUMENTS 4,445,203 4/1984 Iwahashi ............................ 365/189

OTHER PUBLICATIONS cf. Electronica, 1974, vol. 47, No. 5, pp. 37-41.

Primary Examiner—Terrell W. Fears
Attorney, Agent, or Firm—Lilling & Greenspan

[57] ABSTRACT

A transistor storage for entering and storing information in and simultaneously reading information from two columns of a matrix of memory cells with different addresses. The transistor storage comprises two multidigit data buses connected to the columns of the memory cell matrix. Each memory cell of the matrix comprises a storage element and two induced channel transistors connected to the storage element and to the multidigit data buses. The multidigit data buses are connected to write circuits and read amplifiers of a first readout direction and second readout direction, which are connected to an input multidigit data bus and an output multidigit data bus. The write circuits are connected to write and read buses. The read amplifiers are connected to the read bus. A multidigit address bus of the transistor storage is connected to address decoders of the first and second matrix columns; these are connected to access control circuits connected to the write and read buses and to the transistors of all the memory cells of a respective matrix column.

4 Claims, 3 Drawing Figures 4,488,264

TRANSISTOR STORAGE

FIELD OF THE INVENTION

The present invention relates to a n-channel MOS storages containing transistors with induced and built-in channels and, more specifically, to transistor storages.

The invention is applicable to digital intergrated microcircuits of large-scale integration and, more particularly, to microprocessors, microprocessor assemblies, single-chip microcomputers, and memory units.

BACKGROUND OF THE INVENTION

There is known a transistor storage (U.S. Pat. No. 4,004,281 of 1977) wherein information is read from two columns of a matrix of memory cells with different addresses.

The storage comprises a memory cell matrix, address decoders, write circuits and read amplifiers. Each of the memory cells comprises a storage element, a write circuit, and two separate read circuits. The storage under review is disadvantageous in that it comprises much hardware and occupies a large area on the integrated circuit chip. This puts a limitation on the functional integration of the chip.

From the technical standpoint, the closest prototype of the present invention is a storage (cf. Electronica, 1974, vol. 47, No. 5, pp. 37-41) wherein information is read off one column of a memory cell matrix, and write and read circuits are combined in a single memory cell. The storage comprises two multidigit paraphase data buses and memory cells combined into a matrix.

Each line of memory cells is connected to paraphase buses of its own. Each of the memory cells comprises a storage cell and two induced channel transistors. The drains of the transistors are electrically coupled to paraphase inputs/outputs of the storage element, while their sources are connected to their respective paraphase data buses. The storage further contains write circuits and read amplifiers. Outputs of each write circuit and first inputs of each read amplifier are connected to their paraphase buses. A first input of each write circuit and an output of each read amplifier are connected to an information input and to output buses of the storage. Second and third inputs of each write circuit are connected to a write bus and a read bus, respectively. The storage further contains a decoder whose address inputs are connected to an address bus of the storage and outputs are connected to the gates of the induced channel transistors of the respective column of memory cells. This storage contains much less hardware than the one according to U.S. Pat. No. 4,004,281.

However, this storage does provide for reading information from two columns of a matrix of memory cells with different addresses. Such a capability is necessary in a microprocessor register, bearing in mind that two numbers are transmitted to the inputs of the arithmetic-logic unit of the microprocessor, and that the operation results in a single number. Successive readout of two numbers reduces the operating speed of the storage by 37.5 to 50 per cent.

SUMMARY OF THE INVENTION

It is an object of the present invention to improve the response of a transistor storage, while minimizing the amount of hardware.

It is another object of the invention to minimize the area occupied by a transistor storage on the integrated microcircuit chip.

The invention consists in providing a transistor storage for entering and storing information in, and simultaneously reading it from, two columns of a matrix of memory cells with different addresses, comprising two multidigit data buses and memory cells combined into a matrix having each line connected to a first multidigit data bus and a second multidigit data bus of its own, each of the memory cells comprising a storage element and two induced channel transistors whose drains are electrically coupled to paraphase inputs/outputs of the storage cell and sources are connected to the first and second multidigit data buses, the transistor storage further comprising write circuits and read amplifiers of a first read direction, outputs of each write circuit being connected to the multidigit data buses, first inputs of the first direction read amplifiers being connected to the first data bus of a respective matrix line, a first input of each write circuit and an output of each first direction read amplifier being connected to an input multidigit data bus and an output multidigit data bus, respectively, of the transistor storage, a second input and a third input of each write circuit being connected to a write bus and a read bus, respectively, of the transistor storage, second inputs of the first direction read amplifiers being connected to the read bus, the transistor storage further containing an address decoder of the first column of the matrix, whose multidigit input is connected to a multidigit address bus of the transistor storage which is characterized, according to the invention, in that it contains an address decoder of the second matrix column, which makes it possible to address the second column of the memory cell matrix, the address decoder of the second matrix column having its multidigit input connected to the multidigit address bus, and access control circuits which make it possible to read information from the memory cells in two directions and combine write and read circuits in a single memory cell, each access control circuit having its first and second inputs connected to the write bus and read bus, respectively, of the transistor storage, third input connected to the output of the address decoder of the first matrix column, and fourth input connected to the output of the address decoder of the second matrix column, a first output and a second output of each access control circuit being connected to the gates of the first and second transistors, respectively, of all the memory cells of a respective matrix column, and readout amplifiers of a second read direction, whose outputs are connected to the output data bus of the transistor storage, first inputs are connected to the second data bus, and second inputs are connected to the read bus.

It is expedient that each access control circuit should contain two OR gates and three AND gates, first inputs of the first and third AND gates being combined and connected to the read bus, second inputs of the first and second AND gates being combined and connected to the output of the address decoder of the first matrix column, a first input of the second AND gate being connected to the write bus, a second input of the third AND gate being connected to the output of the address decoder of the second matrix column, outputs of the first and third AND gates being connected to first inputs of the first and second OR gates, respectively, the output of the second AND gate being connected to combined second inputs of the first and second OR gates whose outputs are connected to the gates of the first and second transistors, respectively, of the memory cells.

It is highly advisable that each memory cell should contain two built-in channel transistors of which the first is electrically interposed between the paraphase input/output of the storage element and the drain of the first induced channel transistor, and the second is electrically interposed between the source of the second induced channel transistor and the second multidigit data bus, the gates of the first and second built-in channel transistors being connected to the first output and second output, respectively, of the access control circuit.

The invention increases the operating speed of a transistor storage by 50 to 100 per cent without increasing the amount of hardware. The invention makes it possible to increase the number of registers in microprocessors and microprocessor assemblies by 50 per cent without increasing the area of the LSI chip, whereby the functional density of the large-scale integrated circuit is increased by 30 per cent.

BRIEF DESCRIPTION OF THE ACCOMPANYING DRAWINGS

Other objects and advantages of the present invention will become more apparent from a consideration of the following detailed description of a preferred embodiment thereof, taken in conjunction with the accompanying drawings, wherein.

DESCRIPTION OF THE PREFERRED EMBODIMENT

Figure 1:
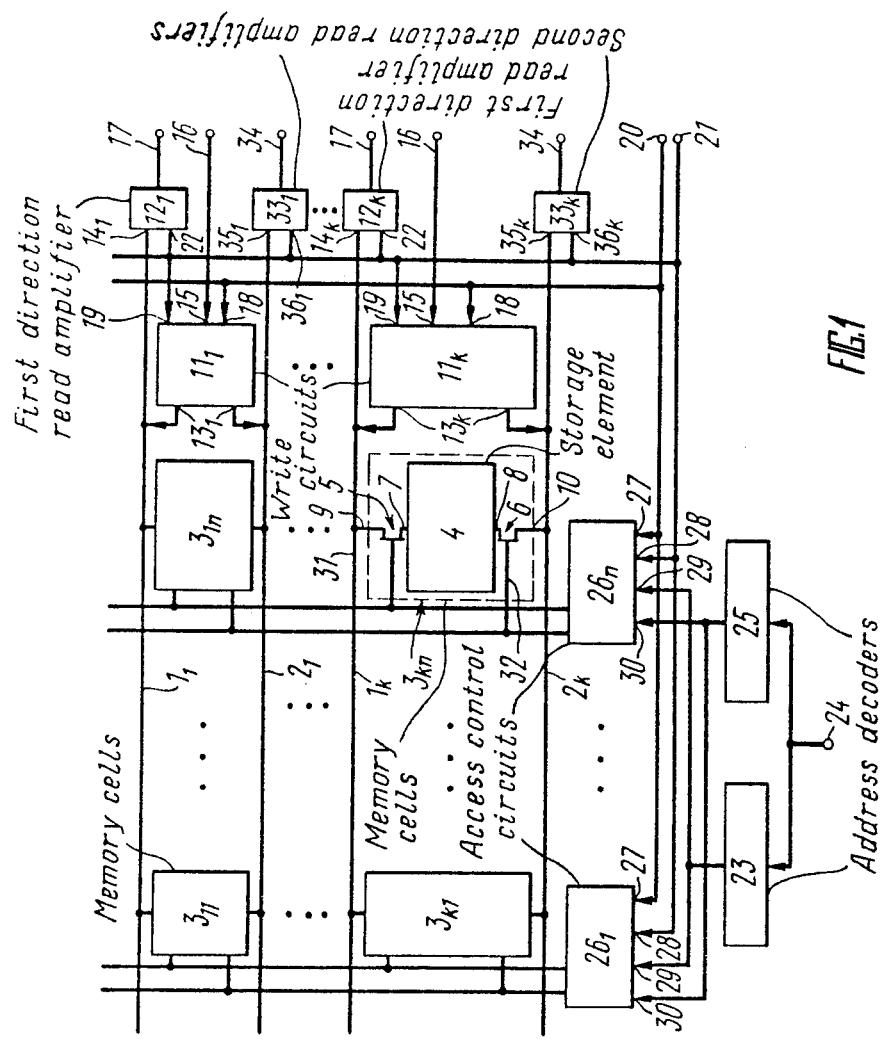
FIG. 1 is a block diagram of a transistor storage in accordance with the invention.

Referring to the attached drawings, the transistor storage according to the invention is intended for entering and storing information in, and simultaneously reading it from, two columns of a matrix of memory cells with different addresses and comprises multidigit data buses $1_1, \ldots, 1_k$ (FIG. 1) and $2_1, \ldots, 2_k$, and memory cells $3_{i1}, \ldots, 3_{in}$ combined into a matrix. Each line of the cells $3_{i1}, \ldots, 3_{in}$ (where i varies from 1 to k) is connected to the buses $1_i$ and $2_i$. Each of the cells $3_{ij}$ comprises a storage element 4 and two induced channel transistors, 5 and 6. Drains 7 and 8 of the transistors 5 and 6, respectively, are electrically coupled to paraphase inputs/outputs of the storage element 4. Sources 9 and 10 of the transistors 5 and 6, respectively, are electrically coupled to the data buses $1_i$ and $2_i$, respectively.

The transistor storage further contains write circuits $11_1, \ldots, 11_k$ and read amplifiers $12_1, \ldots, 12_k$ of a first read direction. Outputs $13_i$ of each write circuit $11_i$ are connected to the multidigit data buses $1_i$ and $2_i$. An input $14_i$ of each read amplifier $12_i$ is connected to the multidigit data bus $1_i$ of the i-th line of the matrix. An input 15 of each write circuit $11_i$ and an output of each amplifier $12_i$ are connected to an input multidigit data bus 16 and an output multidigit data bus 17, respectively, of the transistor storage. Inputs 18 and 19 of each write circuit $11_i$ are connected to a write bus 20 and a read bus 21, respectively, of the transistor storage. An input 22 of each read amplifier $12_i$ is connected to the read bus 21.

The transistor storage according to the invention further contains an address decoder 23 of the first matrix column, whose multidigit input is connected to a multidigit address bus 24. The transistor storage also includes an address decoder 25 of the second matrix column, which makes it possible to address the second column of the memory cell matrix. A multidigit input of the decoder 25 is connected to the multidigit address bus 24. The transistor storage further contains access control circuits $26_1, \ldots, 26_n$ which provide for reading information from the memory cells $3_{ij}$ in two directions and make it possible to combine write and read circuits in a single memory cell $3_{ij}$. Inputs 27 and 28 of each of the access control circuits $26_1, \ldots, 26_n$ are connected to the write bus 20 and read bus 21. An input 29 of each of the access control circuits $26_1, \ldots, 26_n$ is connected to the output of the decoder 23, and an input 30 is connected to the output of the decoder 25.

A first output and a second output of the circuit $26_j$ are connected to gates 31 and 32 of the transistors 5 and 6, respectively, of all the cells $3_{1j}, \ldots, 3_{kj}$.

The transistor storage further contains read amplifiers $33_1, \ldots, 33_k$ of a second read direction, whose outputs are connected to an output multidigit data bus 34. An input $35_i$ of each amplifier $33_i$ is connected to the multidigit data bus $2_i$, and input $36_i$ is connected to the read bus 21.

Figure 2:
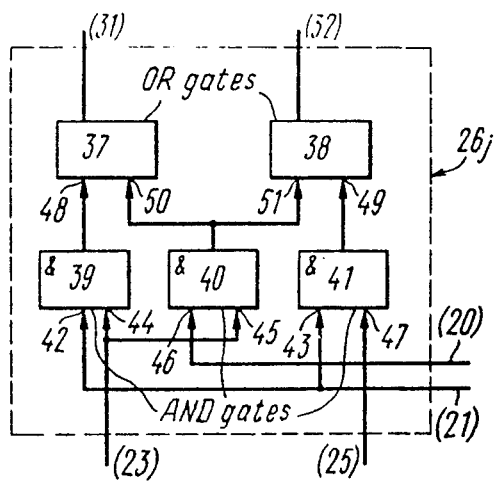
FIG. 2 is a functional diagram of an access control circuit in accordance with the invention.

Each access control circuit $26_j$ (FIG. 2) comprises OR gates 37 and 38 and AND gates 39, 40 and 41. An input 42 of the AND gate 39 and an input 43 of the AND gate 41 are combined and connected to the read bus 21. An input 44 of the AND gate 39 and an input 45 of the AND gate 40 are combined and connected to the outputs of the decoder 23 (FIG. 1).

An input 46 (FIG. 2) of the AND gate 40 is connected to the write bus 20. An input 47 of the AND gate 41 is connected to the output of the decoder 25. Outputs of the AND gates 39 and 41 are connected to inputs 48 and 49 of the OR gates 37 and 38, respectively. The AND gate 40 has its output connected to inputs 50 and 51 of the OR gates 37 and 38, respectively. Outputs of the OR gates 37 and 38 are connected to the gates 31 and 32 of the transistors 5 and 6 (FIG. 1), respectively, of the memory cells $3_{1j}, \ldots, 3_{kj}$.

Figure 3:
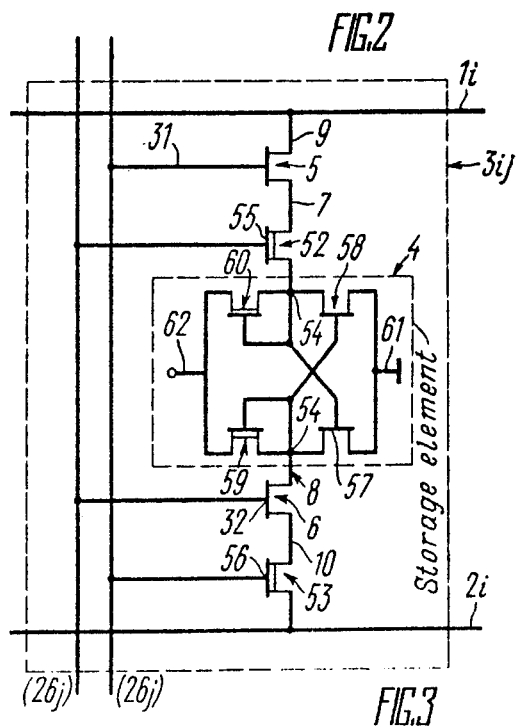
FIG. 3 is a key diagram of a memory cell in accordance with the invention.

Each memory cell $3_{ij}$ comprises built-in channel transistors 52 (FIG. 3) and 53. The transistor 52 is electrically interposed between a paraphase input/output 54 of the storage element 4 and the drain 7 of the induced channel transistor 5. The transistor 53 is electrically interposed between the source 10 of the transistor 6 and the multidigit data bus 2. Gates 55 and 56 of the transistors 52 and 53, respectively, are combined with the gates 31 and 32 of the transistors 5 and 6, respectively, and connected to the outputs of the circuit $26_j$.

The storage element 4 comprises induced channel transistors 57 and 58 and built-in channel transistors 59 and 60. The sources of the transistors 57 and 58 are combined and connected to a common bus $6_1$. The sources of the transistors 59 and 60 are combined and connected to a power line 62. The drains of the transistors 57 and 59 and the gates of the transistors 58 and 59 are combined and connected to the drain 8 of the transistor 6. The drains of the transistors 58 and 60 and the gates of the transistors 57 and 60 are combined and connected to the paraphase output 54.

The transistor storage according to the invention is capable of writing, storing and reading information. Its operation is described hereinbelow with reference to entering information in the j-th column of the matrix of memory cells $3_{1j}, \ldots, 3_{kj}$ and reading information off the 1-th and m-th columns of the matrix of memory cells $3_{1l}, \ldots, 3_{kl}$ and $3_{1m}, \ldots, 3_{km}$.

Information is entered by applying the address code of the column of the matrix of memory cells $3_{1j}, \ldots, 3_{kj}$ (FIG. 1) to the multidigit address bus 24, by applying the data code to the multidigit input data bus 16, and by applying write pulses to the write bus 20. The address code is decoded by the decoder 23 and applied to the inputs 29 of the access control circuits $26_1, \ldots, 26_n$. The logical "1" level is present only at the j-th output of the decoder 23, so only the access control circuit $26_j$ is actuated. A write pulse is applied to the input 27 of the circuit $26_j$ to produce data selection signals at its outputs. These signals are applied to the gates 31 and 32 of the transistors 5 and 6 of the j-th column of the matrix of memory cells $3_{1j}, \ldots, 3_{kj}$. At the same time the write circuits $11_1, \ldots, 11_k$ produce a paraphase information signal which is transmitted, upon the arrival of the write pulse at the inputs 18 of the write circuits $11_1, \ldots, 11_k$, from the paraphase outputs $13_1, \ldots, 13_k$ to the buses $1_1, \ldots, 1_k$ and $2_1, \ldots, 2_k$. The data selection pulse drives the transistors 5 and 6 of the j-th column into conduction, so information is entered in the memory cells $3_{1j}, \ldots, 3_{kj}$; in other words, information from the buses $1_1, \ldots, 1_k$ and $2_1, \ldots, 2_k$ is transmitted from the sources 9 and 10 to the drains 7 and 8 of the transistors 5 and 6 and to the paraphase inputs/outputs of the storage element 4.

The data storage period is marked by the absence of write and read pulses. During this period, there are no data selection pulses at the outputs of the access control circuits $26_1, \ldots, 26_n$. The transistors 5 and 6 of all the memory cells $3_{1j}, \ldots, 3_{kj}$ are off, so the storage elements store the previously entered information. The initial (cophasal) state, i.e. a high potential, is produced at the outputs $13_1, \ldots, 13_k$ of the write buses $11_1, \ldots, 11_k$ and at the data buses $1_1, \ldots, 1_k$ and $2_1, \ldots, 2_k$.

The reading of information from the transistor storage according to the invention is effected by applying an address code to the multidigit address bus 24 and by applying a read pulse to the read bus 21. The address code contains address codes of the 1-th and m-th columns of the matrix of memory cells $3_{1l}, \ldots, 3_{kl}$ and $3_{1m}, \ldots, 3_{km}$. The address codes are decoded by the decoders 23 and 25 and applied to the inputs 29 and 30 of the access control circuits $26_1, 26_n$. According to the logic of the decoders 23 and 25, a logical "1" is applied from the output of the decoder 23 to the input 29 of the access control circuit $26_1$; likewise, a logical "1" is applied from the output of the decoder 25 to the input 27 of the access control circuit $26_m$. Upon the arrival of a read pulse at the inputs 28 of all the access control circuits $26_1, \ldots, 26_n$, data selection signals are produced at the first output of the access control circuit $26_1$ and the second output of the access control circuit $26_m$. The data selection signals are applied to the gates 31 of the transistors 5 of tne 1-th column of the matrix of memory cells $3_{1l}, \ldots, 3_{kl}$ and to the gates 32 of the transistors 6 of the m-th column of the matrix of memory cells $3_{1m}, \ldots, 3_{km}$. The transistors 5 and 6 of the 1-th and m-th columns, respectively, are driven into conduction so that information is transmitted through these transistors 5 and 6 to the data buses $1_1, \ldots, 1_k$ and $2_1, \ldots, 2_k$, i.e. information is transmitted from the paraphase outputs of the storage element 4 and from the drains 7 and 8 to the sources 9 and 10 of the transistors 5 and 6 and to the buses $1_1, \ldots, 1_k$ and $2_1, \ldots, 2_k$, respectively. Thus the same transistors 5 and 6 are incorporated in the write and read circuits of the memory cells $3_{j1}, \ldots, 3_{kn}$. This reduces the amount of hardware employed in the transistor storage.

Upon the arrival of the read pulse, an "off" state is produced at the outputs $13_1, \ldots, 13_k$ of the write circuits $11_1, \ldots, 11_k$. From the buses $1_1, \ldots, 1_k$ and $2_1, \ldots, 2_k$ information is transmitted via the amplifiers $12_1, \ldots, 12_k$ to the output multidigit data buses 17 and 34, respectively. This improves the response of the transistor storage, bearing in mind that information is read off two matrix columns simultaneously.

The access control circuit $26_j$ (FIG. 2) operates as follows. In the case of entering information into the j-th column of the matrix of memory cells $3_{1j}, \ldots, 3_{kj}$, a logical "1" is applied from the output of the decoder 23 to the input 45 of the AND gate 40. A write pulse is applied from the write bus 20 to the second input 46 of the AND gate 40. As a result, a "1" signal is produced at the output of the AND gate 40; this signal is applied to the inputs 50 and 51 of the OR gates 37 and 38, respectively, causing data selection signals to appear at their outputs.

During the reading of information from the transistor storage, logical 1s are applied from the outputs of the decoders 23 and 25 to the input 44 of the AND gate 39 of the circuit $26_1$ and to the input 47 of the AND gate 41 of the circuit $26_m$. A read pulse is applied from the bus 20 to the inputs 42 of the AND gates 39 and to the inputs 47 of the AND gates 41 of all the access control circuits $26_1, \ldots, 26_n$. As a result, "1" signals are produced at the outputs of the AND gates 39 and 41 of the circuits $26_1$ and $26_m$, respectively; these signals are applied via the inputs 48 and 49 of the OR gates 37 and 38 to the outputs of the circuits $26_1$ and $26_m$, whereby data selection signals are produced at the first output of the circuit $26_1$ and at the second output of the circuit $26_m$.

The built-in channel transistors 52 and 53 of the memory cell $3_{ij}$ (FIG. 3) perform an auxiliary function. They are on with both logical 1s and logical 0s at their gates 55 and 56. These transistors are meant to provide the electric connection of the drain 7 of the transistor 5 to the paraphase input/output 54 of the storage element 4 and the electric connection between the source 10 of the transistor 6 and the data bus $2_i$. The introduction of the transistors 52 and 53 into the memory cell $3_{ij}$ helps reduce the area occupied by the cell $3_{ij}$ on the chip, provided this memory cell features what is known as self-matched polysilicon gates. Transistors with self-matched gates are formed by a polysilicon bus crossing the drain-source region. The crossing by polysilicon buses of the gates 31 and 32 of the transistors 5 and 6, respectively, produces two more transistors, 52 and 53. In order to ensure the electric connection of the transistors 5 and 6 to the buses 1 and 2 and to the paraphase inputs/outputs of the storage element 4, the transistors 52 and 53 are provided with built-in channels.

The memory cell $3_{ij}$ operates as follows. In the case of writing, data selection signals are applied to the gates 31, 56 and 32, 55 of the transistors 5, 53 and 6, 52, respectively, so these transistors snap into conduction. Simultaneously, paraphase information is transmitted over the buses $1_i$ and $2_i$; for example, "0" ( the low potential) is transmitted through the bus $1_i$, and "1" (the high potential) is transmitted through the bus $2_i$. "0" is applied via the conducting transistors 5 and 52 to the first paraphase input/output 54 of the storage element 4, and "1" is applied via the conducting transistors 53 and 6 to the second paraphase input/output 54 of the storage element 4. The built-in channel transistors 59 and 60 serve as load transistors for the induced channel transistors 57 and 58; thus in the "on" state, the transistors 59 and 60 display a high resistance. Due to the high resistance of the built-in channel transistor 60, "0" (the low potential level) is applied via the conducting transistors 5 and 52 to the first paraphase input/output 54. This signal is applied to the gate of the transistor 57, so the latter is cut off, and a logical "1" is produced at the second paraphase input/output 54 of the storage element 4. The "1" signal is applied to the gate of the transistor 58 to drive it into conduction. This state of the storage element 4 is maintained after the end of the data selection gate pulses.

As information is being read out, data selection pulses keep arriving at the memory cell $3_{ij}$. Let it be assumed that a data selection pulse is applied to the gates 31 and 56 of the transistors 5 and 53. The transistor 5 is driven into conduction, and the bus $1_i$ discharges to a low level through the conducting transistors 5, 52 and 58.

Thus information is read off the memory cell.

The present invention increases the operating speed of a transistor storage by 50 to 100 per cent without increasing the amount of hardware.

What is claimed is:

1. A transistor storage intended for simultaneously writing, storing and reading information in two directions, which corresponds to simultaneously reading information off two columns of a matrix of memory cells with different addresses, comprising:

a first multidigit data bus; a second multidigit data bus;

an input multidigit data bus; an output multidigit data bus;

a write bus;

a read bus;

a multidigit address bus;

memory cells combined into a matrix; lines and columns of said matrix;

each of said lines of said matrix being connected to said first and second multidigit data buses;

each of said memory cells of said matrix comprising a storage element, a first induced channel transistor and a second induced channel transistor;

drains, sources and gates of said first and second induced channel transistors;

paraphase inputs/outputs of said storage element;

said drains of said first and second induced channel transistors being electrically coupled to said paraphase inputs/outputs or said storage element;

said sources of said first and second induced channel transistors being connected to said first and second multidigit data buses;

write circuits; a first input, a second input, a third input, and outputs of each of said write circuits;

read amplifiers of a first readout direction; a first input, a second input, and outputs of each of said first direction read amplifiers;

said outputs of each of said write circuits being connected to said multidigit data buses;

said first inputs of said first direction read amplifiers being connected to said first data bus of a respective matrix line;

said first input of each of said write circuits being connected to said input multidigit data bus;

said output of each of said first direction read amplifiers being connected to said output multidigit data bus;

said second input of each of said write circuits being connected to said write bus;

said third input of each of said write circuits being connected to said read bus;

said second inputs of said first direction read amplifiers being connected to said read bus;

an address decoder of the first matrix column; a multidigit input and an output of said address decoder of the first matrix column;

said multidigit input of said address decoder of the first matrix column being connected to said multidigit address bus of the transistor storage;

the improvement residing in the fact the transistor storage according to the invention comprises:

an address decoder of the second matrix column, intended for addressing the second column of the memory cell matrix; a multidigit input and an output of said address decoder of the second matrix column;

said multidigit input of said address decoder of the second matrix column being connected to said multidigit address bus;

access control circuits for reading information off said memory cells in two directions and combining write and read circuits in one and the same memory cell; a first input, a second input, a third input, a fourth input, a first output and a second output of each of said access control circuits;

said first input of each of said access control circuits being connected to said write bus of the transistor storage;

said second input of each of said access control circuits being connected to said read bus of the transistor storage;

said third input of each of said access control circuits being connected to said output of said address decoder of the first matrix column;

said fourth input of each of said access control circuits being connected to said output of said address decoder of the second matrix column;

said first output of each of said access control circuits being connected to said gate of said first transistor of each of said memory cells of a respective matrix column;

said second output of each of said access control circuits being connected to said gate of said second transistor of each of said memory cells of a respective matrix column;

read amplifiers of a second readout direction;

a first input, a second input and outputs of each of said second direction read amplifiers;

said outputs of said second direction read amplifiers being connected to said output multidigit data bus of the transistor storage;

said first inputs of said second direction read amplifiers being connected to said second data bus;

said second inputs of said second direction read amplifiers being connected to said read bus.

2. A transistor storage as claimed in claim 1, wherein each access control circuit comprises:

a first OR gate and a second OR gate; a first input, a second input, and an output of each of said OR gates;

a first AND gate, a second AND gate, and a third AND gate;

a first input, a second input, and an output of each of said AND gates;

said first inputs of said first and third AND gates being combined and connected to said read bus;

said second inputs of said first and second AND gates being combined and connected to said output of said address decoder of the first matrix column;

said first input of said second AND gate being connected to said write bus;

said second input of said third AND gate being connected to said output of said address decoder of the second matrix column;

said output of said first AND gate being connected to said first input of said first OR gate;

said output of said third AND gate being connected to said first input of said second OR gate;

said output of said second AND gate being connected to said combined second inputs of said first and second OR gates;

said output of said first OR gate being connected to said gate of said first transistor of each of said memory cells;

said output of said second OR gate being connected to said gate of said second transistor of each of said memory cells.

3. A transistor storage as claimed in claim 1, wherein each memory cell comprises:

a first built-in channel transistor and a second built-in channel transistor; gates of said built-in channel transistors;

said first built-in channel transistor being electrically interposed between said paraphase input/output of said storage element and said drain of said first induced channel transistor;

said second built-in channel transistor being electrically interposed between said source of said second induced channel transistor and said second multi-digit data bus;

said gate of said first built-in channel transistor being connected to said first output of said access control circuit;

said gate of said second built-in channel transistor being connected to said second output of said access control circuit.

4. A transistor storage as claimed in claim 2, wherein each memory cell comprises:

a first built-in channel transistor and a second built-in channel transistor; gates of said built-in channel transistors;

said first built-in channel transistor being electrically interposed between said paraphase input/output of said storage element and said drain of said first induced channel transistor;

said second built-in channel transistor being electrically interposed between said source of said second induced channel transistor and said second multi-digit data bus;

said gate of said first built-in channel transistor being connected to said first output of said access control circuit;

said gate of said second built-in channel transistor being connected to said second output of said access control circuit.

* * * * *